United States Patent
Fujita et al.

(10) Patent No.: US 12,514,011 B2
(45) Date of Patent: Dec. 30, 2025

(54) OPTICAL DEVICE PACKAGE

(71) Applicant: Shanghai Tianma Micro-Electronics Co., Ltd., Shanghai (CN)

(72) Inventors: Akira Fujita, Kanagawa (JP); Futoshi Nakanishi, Kanagawa (JP); Shingo Saigou, Kanagawa (JP); Nobuya Seko, Kanagawa (JP)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 440 days.

(21) Appl. No.: 18/157,522

(22) Filed: Jan. 20, 2023

(65) Prior Publication Data
US 2023/0282659 A1  Sep. 7, 2023

(30) Foreign Application Priority Data
Jan. 28, 2022  (JP) ................. 2022-011491

(51) Int. Cl.
*H10F 39/00*  (2025.01)
*H01L 23/00*  (2006.01)

(52) U.S. Cl.
CPC ......... *H10F 39/804* (2025.01); *H01L 23/562* (2013.01); *H10F 39/811* (2025.01)

(58) Field of Classification Search
None
See application file for complete search history.

(56) References Cited

U.S. PATENT DOCUMENTS

| 2011/0228204 A1 | 9/2011 | Watanabe |
| 2016/0172417 A1* | 6/2016 | Chen ............... H10F 39/182 438/70 |
| 2018/0047651 A1* | 2/2018 | Chen ............... H01L 21/6835 |

FOREIGN PATENT DOCUMENTS

| JP | 2001-215483 A | 8/2001 |
| JP | 2008-233596 A | 10/2006 |
| JP | 2010-085811 A | 4/2010 |
| JP | 2011-18747 A | 1/2011 |
| JP | 2014-022573 A | 2/2014 |
| JP | 2014-172770 A | 9/2014 |

OTHER PUBLICATIONS

Communication issued Oct. 28, 2025 in Japanese Application No. 2022-011491.

* cited by examiner

*Primary Examiner* — Bo B Jang
(74) *Attorney, Agent, or Firm* — Sughrue Mion, PLLC

(57) ABSTRACT

An optical device package includes a glass substrate, a warpage reducing film, a redistribution layer, and a semiconductor element. The warpage reducing film is disposed directly or indirectly on the glass substrate. The redistribution layer includes a wiring sublayer and an insulating sublayer. The wiring sublayer and the insulating sublayer are at least partially disposed on the warpage reducing film. The semiconductor element is mounted on the redistribution layer.

7 Claims, 11 Drawing Sheets

OPTICAL DEVICE PACKAGE

CROSS-REFERENCE TO RELATED APPLICATION

This application claims the benefit of Japanese Patent Application No. 2022-11491, filed on Jan. 28, 2022, the entire disclosure of which is incorporated by reference herein.

FIELD

This application relates to an optical device package.

BACKGROUND

Some sophisticated optical device packages, or packages that are provided with optical elements emitting or receiving light and have various fan-out structures including redistribution layers (RDLs) are used as interposers for connecting motherboards. General examples of techniques for fabricating packages having fan-out structures include: (1) a packaging technique of forming redistribution-layer circuit patterns, the width of which and the interval between which are relatively rough, on a large substrate on the basis of technology for fabricating printed circuit boards; (2) a fan-out wafer level package (FOWLP) technique of forming a redistribution layer having circuit patterns, the width of which and the interval between which are minute, on a wafer-size substrate on the basis of technology for fabricating microwires of semiconductor wafers; and (3) a fan-out panel level package (FOPLP) technique having intermediate characteristics between the techniques (1) and (2). The sophistication of optical device packages accompanies miniaturization of wiring, and highly miniaturized wiring cannot be formed on the basis of the technology for fabricating printed circuit boards. Unfortunately, the FOWLP technique achieves a low yield (small number) of packages due to the size limitation of wafer, leading to high cost and low productivity. Recent interest is thus focused on the FOPLP technique that is capable of forming micro-wiring patterns at a certain level on a large substrate, and achieves a high yield (large number) of semiconductor packages with high productivity at low cost. In this viewpoint, some procedures are suggested that involve fabricating redistribution layers to constitute multiple packages at once on a glass substrate serving as a support substrate, mounting semiconductor elements with or without mold sealing, separating the support substrate, and then dividing the resultant into individual packages. Unfortunately, these procedures of fabricating packages having fan-out structures on the glass substrate suffer from warpage of the glass substrate and other layers after the formation of redistribution layers and other layers, for example, due to the difference in thermal expansion between the glass substrate serving as the support substrate and the material of the redistribution layers. In particular, a larger substrate tends to have larger warpage. The warpage may cause various troubles in the fabrication process, such as stop of the production line and generation of nonconforming products, leading to low productivity.

Unexamined Japanese Patent Application Publication No. 2014-22573 discloses an image sensor including an imaging chip, a glass substrate opposed to the imaging chip, a silicon oxide film disposed on the surface of the glass substrate that faces the imaging chip so as to cover an imaging region, and a metal wiring layer stacked on the glass substrate and electrically connected to a terminal of the imaging chip. This image sensor is fabricated by transferring the silicon oxide film and the wiring layer on a silicon substrate to the glass substrate and serves to reduce warpage of the glass substrate and other layers.

The process of fabricating the image sensor disclosed in Unexamined Japanese Patent Application Publication No. 2014-22573 removes the silicon substrate after the transfer, and thus suffers from waste of materials. Another problem is that the number of available image sensors from a silicon wafer is limited depending on the size of the image sensors because the size of the silicon wafer is generally defined. This situation demands an optical device package that can be fabricated at low cost with high productivity.

SUMMARY

An optical device package according to an aspect of the present disclosure includes: a glass substrate; a warpage reducing film disposed directly or indirectly on the glass substrate; a redistribution layer including a wiring sublayer and an insulating sublayer, which are at least partially disposed on the warpage reducing film; and a semiconductor element mounted on the redistribution layer.

It is to be understood that both the foregoing general description and the following detailed description are exemplary and explanatory and are not restrictive of this disclosure.

BRIEF DESCRIPTION OF THE DRAWINGS

A more complete understanding of this application can be obtained when the following detailed description is considered in conjunction with the following drawings, in which.

DETAILED DESCRIPTION

An optical device package according to an embodiment of the present disclosure is described below with reference to the accompanying drawings.

Figure 1:
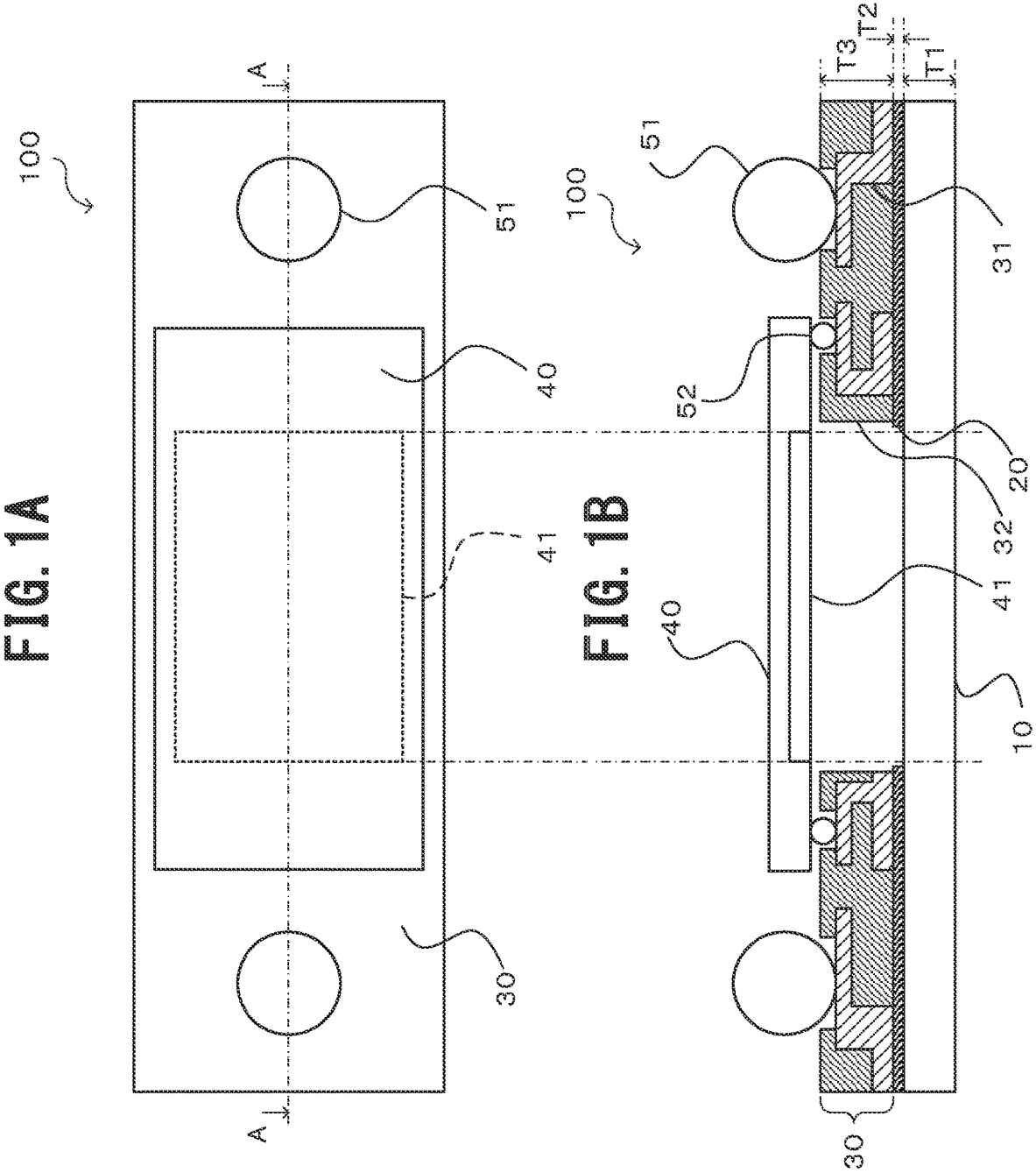
FIG. 1A illustrates an optical device package according to an embodiment.
FIG. 1B is a sectional view taken along the line A-A of FIG. 1A.

As illustrated in FIG. 1, an optical device package 100 according to this embodiment includes a glass substrate 10, a warpage reducing film 20, a redistribution layer 30, and a semiconductor element 40. The optical device package 100 is fabricated by a fan-out panel level package (FOPLP) technique such that the redistribution layer 30 serves as an interposer for connecting the semiconductor element 40 to a motherboard. This embodiment is directed to an example in which the semiconductor element 40 is an optical element having a rectangular light-receiving region 41 at the center.

The glass substrate 10 has an area larger than that of the light-receiving region 41 to cover and protect the entire light-receiving region 41. The glass substrate 10 may be an alkali-free glass substrate having a coefficient of linear expansion substantially identical to that of the semiconductor element 40, or a glass substrate having a coefficient of linear expansion higher than that of the semiconductor element 40. In particular, if the glass substrate 10 is fabricated in the same production line as a thin film transistor (TFT) substrate for the liquid crystal display, for example, the glass substrate 10 is preferably an alkali-free glass substrate (which generally indicates a glass substrate containing no alkaline component or containing a trace amount of alkaline components), because alkaline components eluted from the glass substrate may adversely affect the characteristics of the TFT substrate. In addition, the glass substrate 10 preferably has high clarity so as not to affect light incident to the light-receiving region 41 of the semiconductor element 40. For example, an applicable glass substrate has a transmittance of 60% or higher of light having a wavelength of 400 nm to 1,000 nm. The glass substrate 10 preferably has a thickness T1 of 0.3 mm or larger and 1.1 mm or smaller. The glass substrate 10 lacks the warpage reducing film 20 and the redistribution layer 30 in a portion opposed to the light-receiving region 41.

The warpage reducing film 20 is disposed on the glass substrate 10 to reduce warpage of the glass substrate 10. The warpage reducing film 20 contains silicon nitride ($SiN_x$). The warpage reducing film 20 is formed by a procedure, such as chemical vapor deposition (CVD), deposition, or sputtering. The warpage reducing film 20 has a thickness T2 that preferably satisfies $T2/(T3)^3 \geq 7.38 \times 10^{-5}$ where T3 indicates the total thickness of the redistribution layer 30. The warpage reducing film 20 having this configuration can appropriately reduce warpage of the glass substrate 10, and can therefore prevent troubles in the fabrication process due to warpage and thus maintain sufficient productivity. The thickness T2 of the warpage reducing film 20 is preferably larger than 0 µm and 5 µm or smaller, and more preferably 0.3 µm or larger and 1.1 µm or smaller.

The redistribution layer 30 is disposed on the warpage reducing film 20, and includes at least one wiring sublayer 31 and at least one insulating sublayer 32. The wiring sublayer 31 includes a metal wiring sublayer, such as copper wiring sublayer, aluminum wiring sublayer, or silver wiring sublayer. The wiring sublayer 31 has a thickness of 5 µm, for example. The wiring sublayer 31 is provided with bumps 51 for establishing electrical connection to a motherboard or another component. The insulating sublayer 32 includes an insulating polyimide sublayer, for example. The insulating sublayer 32 has a large thickness to appropriately cover the wiring sublayer 31, for example, a thickness of 8 µm. The total thickness T3 of the redistribution layer 30 is preferably larger than 0 µm and 40 µm or smaller, and more preferably 8 µm or larger and 24 µm or smaller.

The semiconductor element 40 is mounted on the redistribution layer 30. The semiconductor element 40 includes an optical element in the light-receiving region 41 to receive light via the glass substrate 10. The semiconductor element 40 includes a plurality of pixels for photoelectric conversion of a received subject image. The semiconductor element 40 is provided with bumps 52 outside the light-receiving region 41 to establish electrical connection to the wiring sublayer 31. The semiconductor element 40 may also include an analog-digital (AD) converter to receive analog signals output from the light-receiving region 41 and convert the received analog signals into digital signals, as well as signal lines electrically connected to the bumps 52. The AD converter is disposed outside the light-receiving region 41. In addition to the AD converter, the semiconductor element 40 may further include a readout circuit to read analog signals generated in the light-receiving region 41, a timing control circuit to drive the readout circuit, and a noise canceling circuit to cancel noise in the read signals, outside the light-receiving region 41, for example.

A process of fabricating the optical device package 100 having the above-described configuration is described below.

Figure 2:
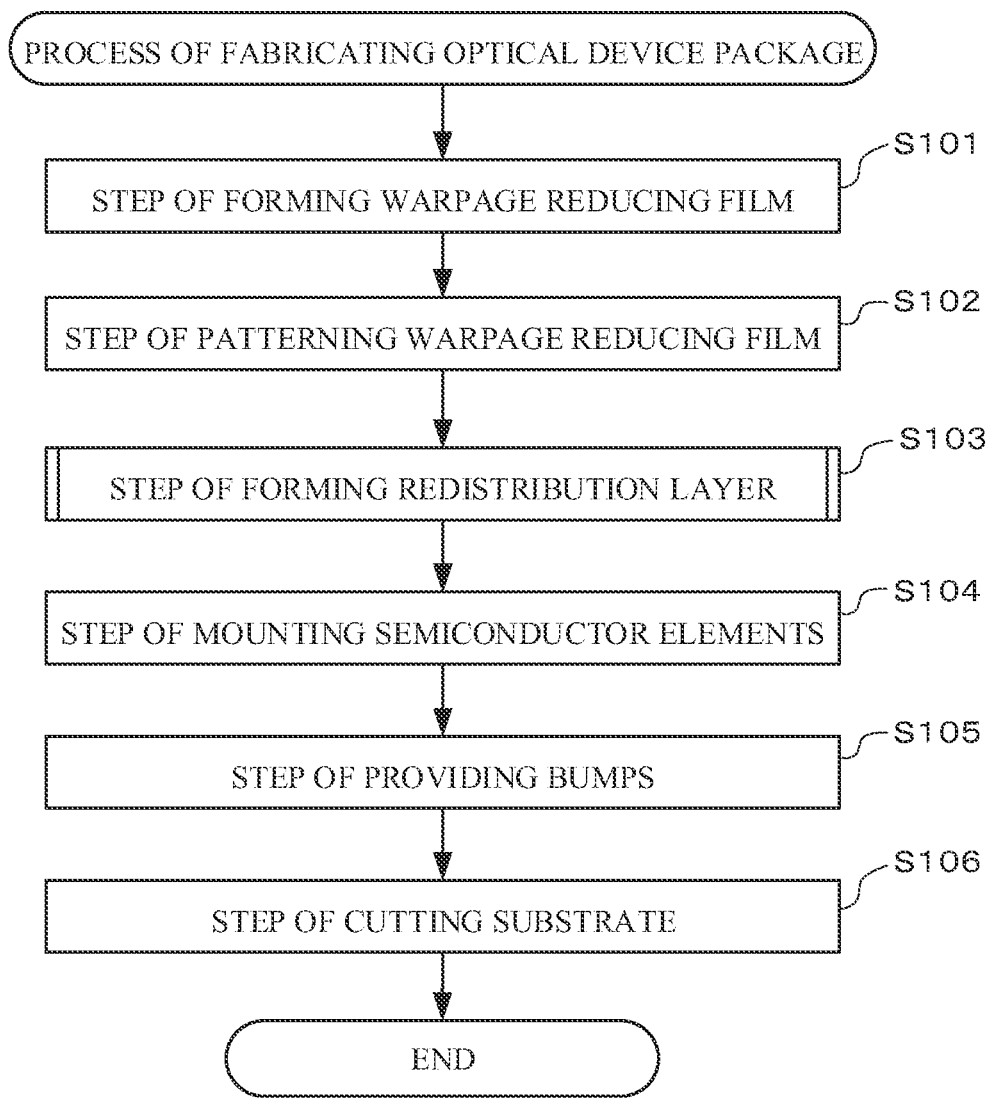
FIG. 2 is a flowchart illustrating a process of fabricating the optical device package according to the embodiment.
Figure 3:
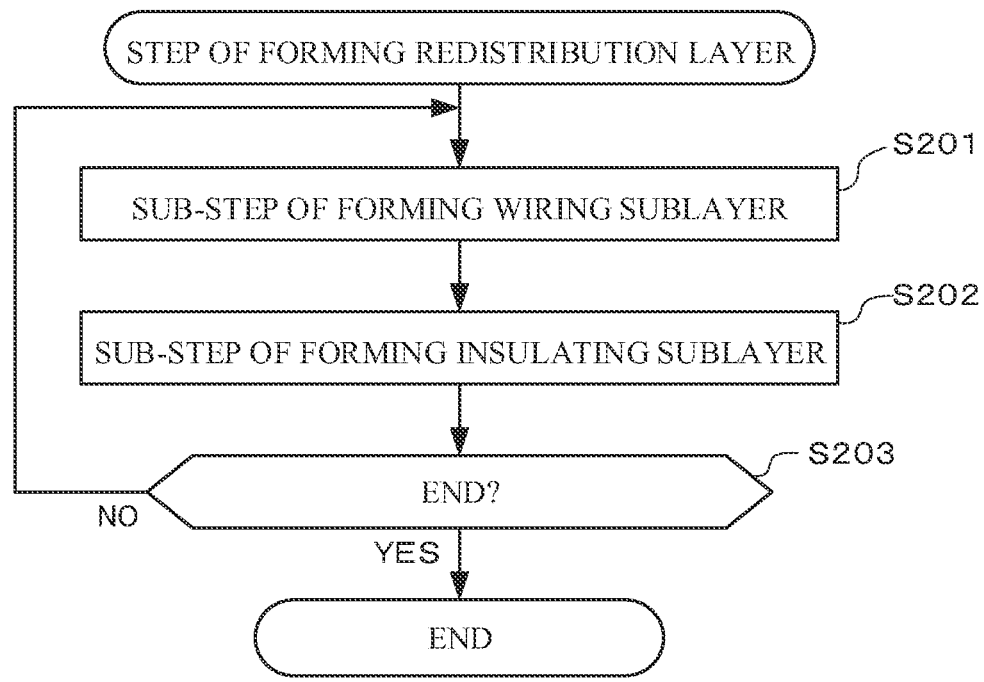
FIG. 3 is a flowchart illustrating a step of forming a redistribution layer according to the embodiment.

As illustrated in FIG. 2, the process of fabricating the optical device package 100 involves a step of forming a warpage reducing film (Step S101), a step of patterning the warpage reducing film (Step S102), a step of forming a redistribution layer (Step S103), a step of mounting semiconductor elements (Step S104), a step of providing bumps (Step S105), and a step of cutting the substrate (Step S106). As illustrated in FIG. 3, the step of forming a redistribution layer (Step S103) involves a sub-step of forming a wiring sublayer (Step S201) and a sub-step of forming an insulating sublayer (Step S202).

The description is directed to a process of fabricating the optical device package 100 that involves forming multiple optical device packages 100 on a single glass substrate 10 and then dividing the resultant into individual packages.

Figure 4:
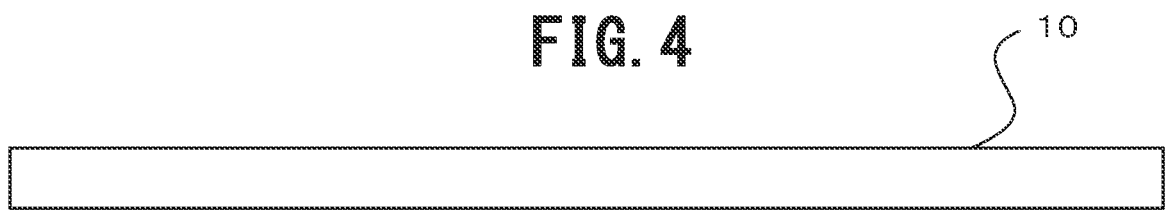
FIG. 4 is a diagram for describing the process of fabricating the optical device package according to the embodiment.
Figure 5:
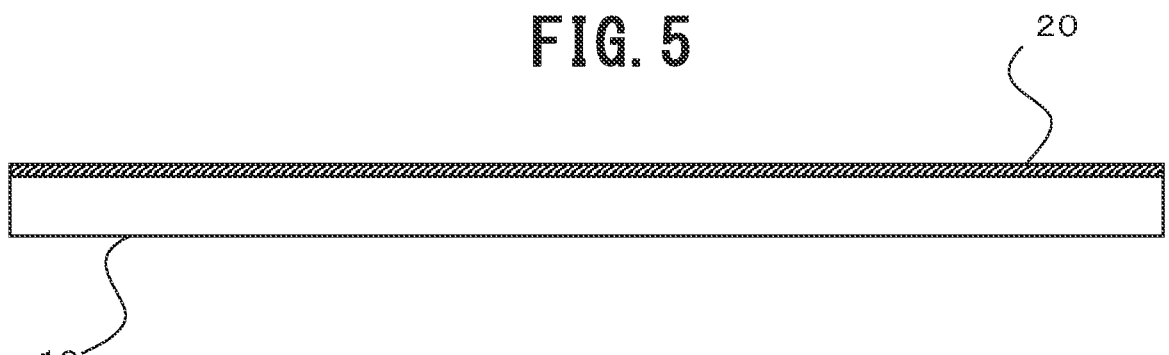
FIG. 5 is another diagram for describing the process of fabricating the optical device package according to the embodiment.

In the step of forming a warpage reducing film (Step S101), as illustrated in FIG. 5, a warpage reducing film 20 containing silicon nitride is formed on the glass substrate 10 illustrated in FIG. 4. The glass substrate 10 has a size of 370 mm×470 mm×0.7 mm, for example. The warpage reducing film 20 is formed by a procedure, such as CVD, deposition, or sputtering. The glass substrate 10 in this stage has warpage (convex warpage) such that the surface provided with the warpage reducing film 20 is protruded upward. This convex warpage is mitigated by the own weight of the glass substrate 10 and is not likely to cause a problem in the fabrication process.

Figure 6:
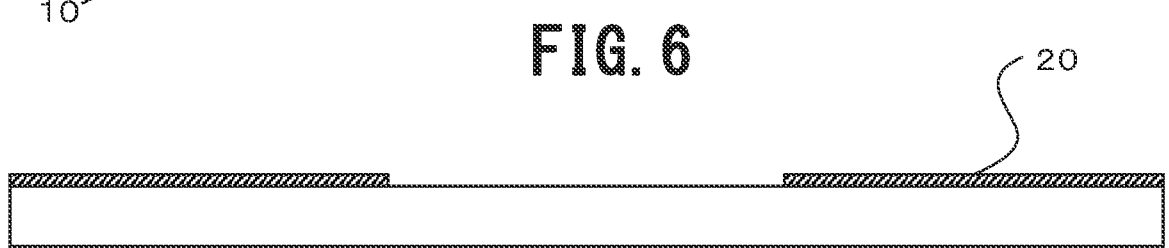
FIG. 6 is another diagram for describing the process of fabricating the optical device package according to the embodiment.

In the step of patterning the warpage reducing film (Step S102), as illustrated in FIG. 6, at least the portions of the warpage reducing film 20 opposed to the light-receiving regions 41 are removed from the glass substrate 10 provided with the warpage reducing film 20. The warpage reducing film 20 may be removed by any procedure. An exemplary procedure involves applying a resist to the portions planned to maintain the warpage reducing film 20, removing the portions of the warpage reducing film 20 not coated with the resist by a procedure, such as etching, and then peeling the resist. The removed portions of the warpage reducing film 20 within the areas substantially equal to the light-receiving regions 41 correspond to approximately 0% to 15% of the entire substrate. The warpage reducing film 20 even after this partial removal can thus maintain the convex warpage of the whole glass substrate 10 and can bring about effects of warpage reduction. In other words, the level of convex warpage can be controlled by an amount of removal of the warpage reducing film 20. In addition, removal of the portions of the warpage reducing film 20 opposed to the light-receiving regions 41 eliminates the adverse effects of the warpage reducing film 20 to attenuate propagating light having some wave lengths, and can therefore ensure the performance of receiving light at the semiconductor elements 40.

In the step of forming a redistribution layer (Step S103), a redistribution layer 30 including at least one wiring sublayer 31 and at least one insulating sublayer 32 is formed on the warpage reducing film 20.

Figure 7:
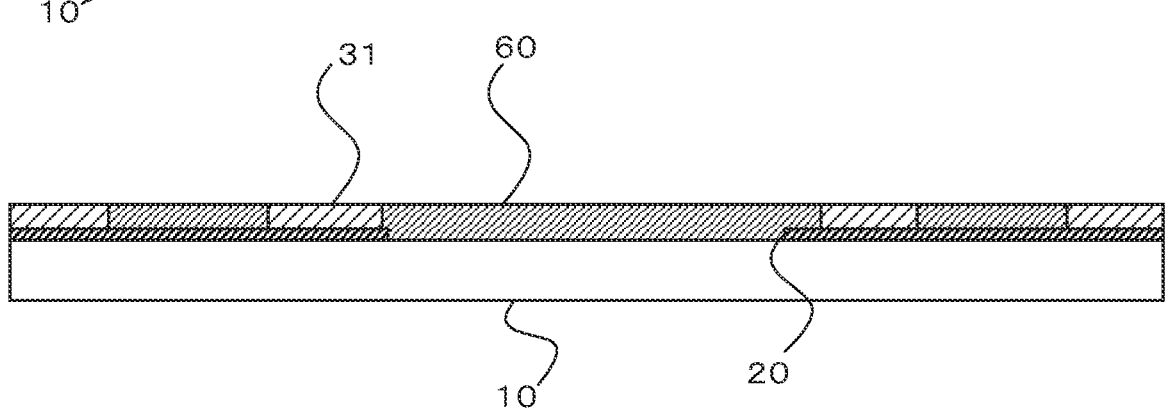
FIG. 7 is another diagram for describing the process of fabricating the optical device package according to the embodiment.
Figure 8:
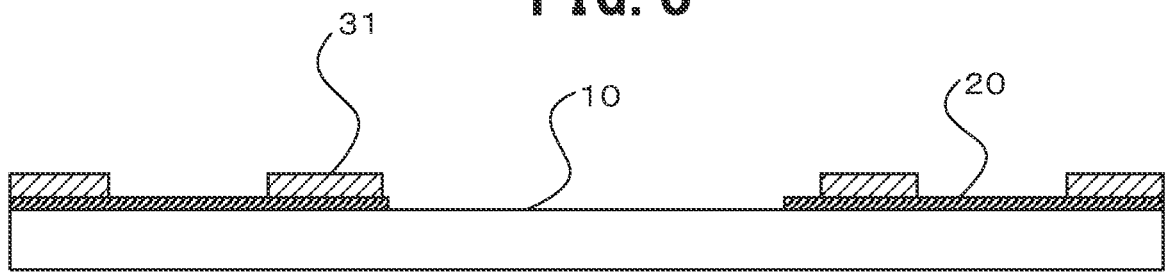
FIG. 8 is another diagram for describing the process of fabricating the optical device package according to the embodiment.

In the sub-step of forming a wiring sublayer (Step S201) illustrated in FIG. 3, a wiring sublayer 31 is formed on the glass substrate 10 provided with the warpage reducing film 20. In detail, as illustrated in FIG. 7, the sub-step of forming the wiring sublayer 31 containing copper involves forming a copper seed layer (not illustrated) on the surface by sputtering, applying a resist 60 to portions to be provided with no wiring sublayer 31, and then providing copper to constitute the wiring sublayer 31 by electrolytic plating, for example. The copper seed layer (not illustrated) is an underlying layer for electrolytic plating of the wiring sublayer 31 and is an electrode layer subject to precipitation during plating. The resist 60 is then peeled, followed by etch removal of the portions (covered with the resist 60) of the copper seed layer (not illustrated), which are not necessarily as circuit patterns. This sub-step yields the glass substrate 10 provided with the wiring sublayer 31 illustrated in FIG. 8.

Figure 9:
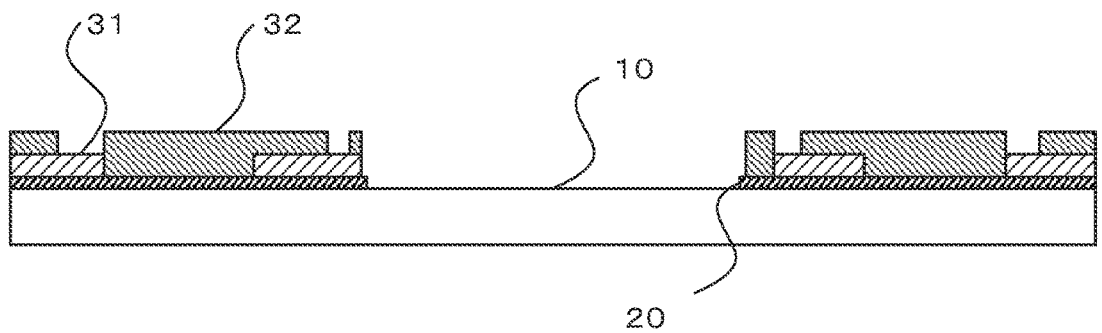
FIG. 9 is another diagram for describing the process of fabricating the optical device package according to the embodiment.
Figure 10:
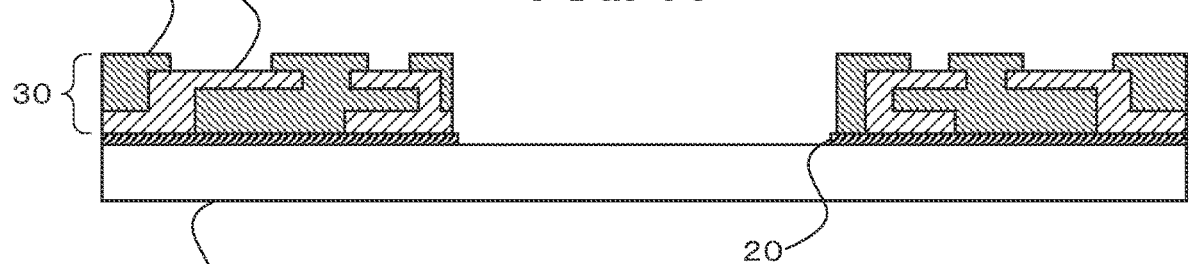
FIG. 10 is another diagram for describing the process of fabricating the optical device package according to the embodiment.

In the sub-step of forming an insulating sublayer (Step S202), an insulating sublayer 32 is formed on the glass substrate 10 provided with the wiring sublayer 31. The insulating sublayer 32 includes an insulating polyimide sublayer, for example. The sub-step of forming the insulating sublayer 32 including the insulating polyimide sublayer involves application of polyimide, light exposure and development, and then firing. This sub-step yields the glass substrate 10 provided with the insulating sublayer 32 illustrated in FIG. 9. The entire substrate including the glass substrate 10 and the redistribution layer 30 in this stage receives a stress of warpage (concave warpage) such that the surface provided with the redistribution layer 30 is recessed downward, due to cure shrinkage of polyimide and recrystallization of copper, for example. This stress is compensated by the stress of convex warpage applied from the warpage reducing film 20, resulting in a reduction in total amount of warpage. When the glass substrate 10 requires another wiring sublayer 31 and another insulating sublayer 32 (Step S203; NO), the process returns to Step S201 and repeats Steps S201 to S203. The repetition may be terminated after the sub-step of forming a wiring sublayer (Step S201). The amount of concave warpage is increased after every formation of the wiring sublayer 31 and the insulating sublayer 32, but is smaller in comparison to that in the case of no warpage reducing film 20. The sublayers can be stacked until the warpage reaches the maximum amount allowable in the process. The maximum amount of warpage allowable in the process indicates, for example, the highest amount of warpage that still allows various manufacturing apparatuses to attract and retain the substrate. That is, a substrate having the maximum amount of warpage or smaller can normally undergo the fabrication process, which involves attraction for substrate transfer and accommodation into a certain cassette, or can be processed in the production line. When formation of the wiring sublayer 31 and the insulating sublayer 32 is completed (Step S203; YES), the step of forming a redistribution layer (Step S103) is terminated. This step yields the glass substrate 10 provided with the redistribution layer 30 illustrated in FIG. 10. The glass substrate 10 after the step of forming a redistribution layer (Step S103) may have some warpage, which does not interfere with the subsequent step of mounting semiconductor elements (Step S104).

Figure 11:
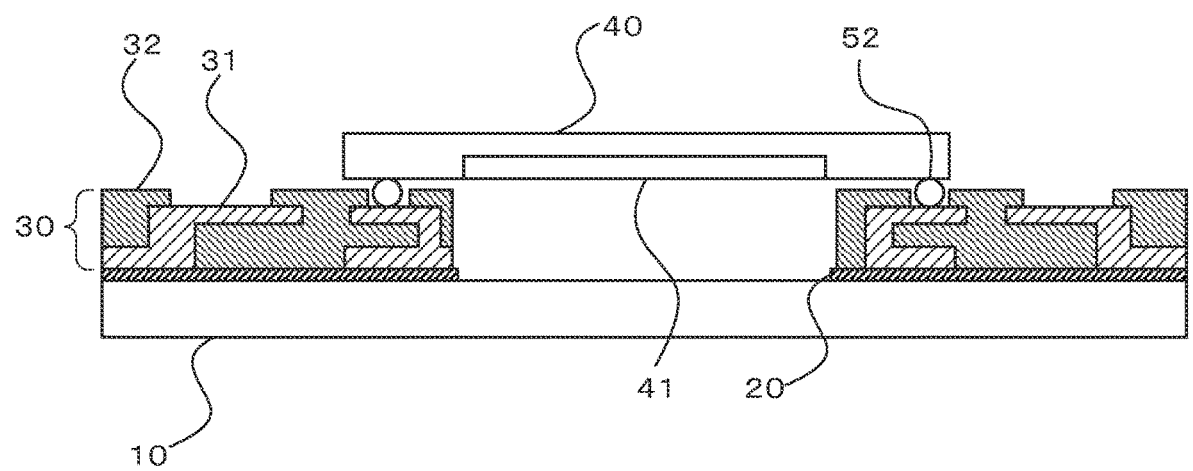
FIG. 11 is another diagram for describing the process of fabricating the optical device package according to the embodiment.

In the step of mounting semiconductor elements (Step S104), as illustrated in FIG. 11, semiconductor elements 40 are mounted by flip-chip bonding on the glass substrate 10 provided with the redistribution layer 30. The semiconductor elements 40 may also be mounted by another method, such as reflow soldering or ultrasonic bonding.

The step of mounting semiconductor elements (Step S104) may be followed by a step of mold sealing (not illustrated) for protecting the semiconductor elements 40, as required. The step of mold sealing may generate a stress of concave warpage on the surface provided with the redistribution layer 30 but can be compensated by the stress of convex warpage applied from the warpage reducing film 20.

In the step of providing bumps (Step S105), as illustrated in FIGS. 1A and 1B, bumps 51 are attached to the wiring sublayer 31 to achieve electrical connection to a motherboard or another component.

Figure 12:
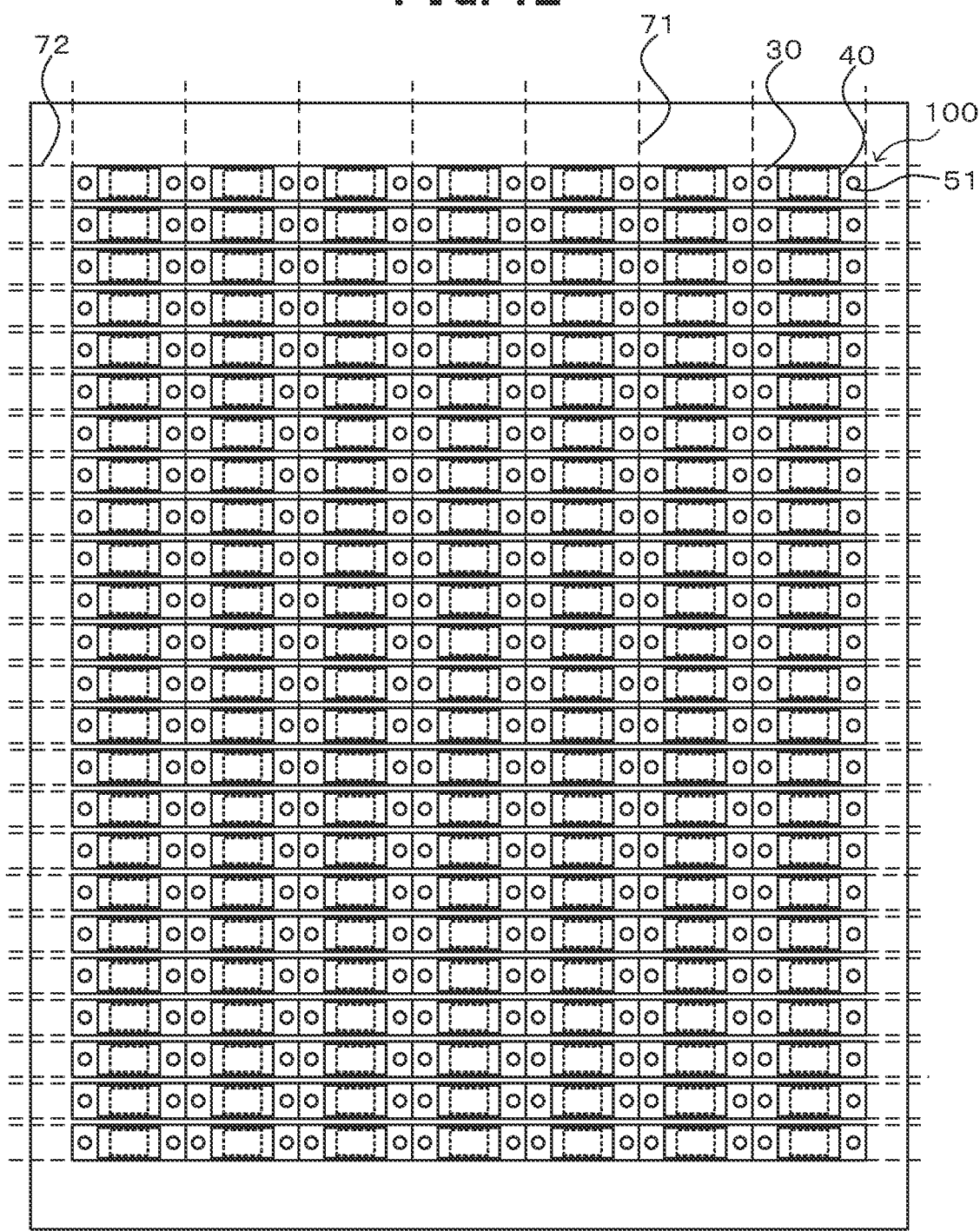
FIG. 12 is another diagram for describing the process of fabricating the optical device package according to the embodiment.

In the step of cutting the substrate (Step S106), as illustrated in FIG. 12, the resulting substrate is cut along cutting lines 71 and 72 into separate optical device packages 100 disposed on the glass substrate 10. This step yields the optical device packages 100 one of which is illustrated in FIGS. 1A and 1B. Although the optical device packages 100 are spaced from each other in the longitudinal direction in this example, the optical device packages 100 may also adjoin each other with no space therebetween in the longitudinal direction.

As described above, in the optical device package 100 and the process of fabricating the optical device package 100 according to this embodiment, the warpage reducing film 20 can reduce troubles caused by warpage of the glass substrate 10 in the fabrication process and can thus improve productivity. In detail, the glass substrate 10 is caused by the warpage reducing film 20 to have convex warpage and receives a stress of concave warpage after stacking of the redistribution layer 30, so that the total amount of warpage is mitigated. This configuration can prevent occurrence of a product that has excessive warpage and cannot be processed in the fabrication process. The configuration can also achieve fabrication of a large number of optical device packages at once using a glass substrate, which has an area larger than that of a wafer used in an FOWLP technique. The warpage reducing film 20 can appropriately reduce warpage of the glass substrate 10, because the thickness T2 of the warpage reducing film 20 satisfies $T2/(T3)^3 \geq 7.38 \times 10^{-5}$ where T3 indicates the total thickness of the redistribution layer 30. In the optical device package 100 according to this embodiment, the glass substrate 10 serves as a support substrate (carrier glass) during formation of the redistribution layer 30, and also serves as a cover for protecting the semiconductor element 40 without being peeled, thereby contributing to high productivity. The semiconductor element 40 is mounted by flip-chip bonding on the redistribution layer 30 disposed on the glass substrate 10. The configuration, in which the portion opposed to the light-receiving region 41 of the semiconductor element 40 lacks the warpage reducing film 20 and the redistribution layer 30, can prevent light incident to the light-receiving region 41 from being attenuated by the warpage reducing film 20 and the redistribution layer 30 and can ensure the performance of the sensor. Although the portion opposed to the light-receiving region 41 of the semiconductor element 40 lacks the warpage reducing film 20, this configuration does not significantly impair the effects of compensation for warpage. In addition, at least the undermost wiring sublayer 31 and the warpage reducing film 20 containing silicon nitride are in contact with each other at the interface therebetween. The wiring sublayer 31 and the silicon nitride film in contact with each other can improve the adherence. It is also conceivable that the glass substrate provided with the warpage reducing film 20 is replaced with a glass substrate having original convex warpage, but such a glass substrate having original convex warpage is not readily available, resulting in low productivity.

Figure 13:
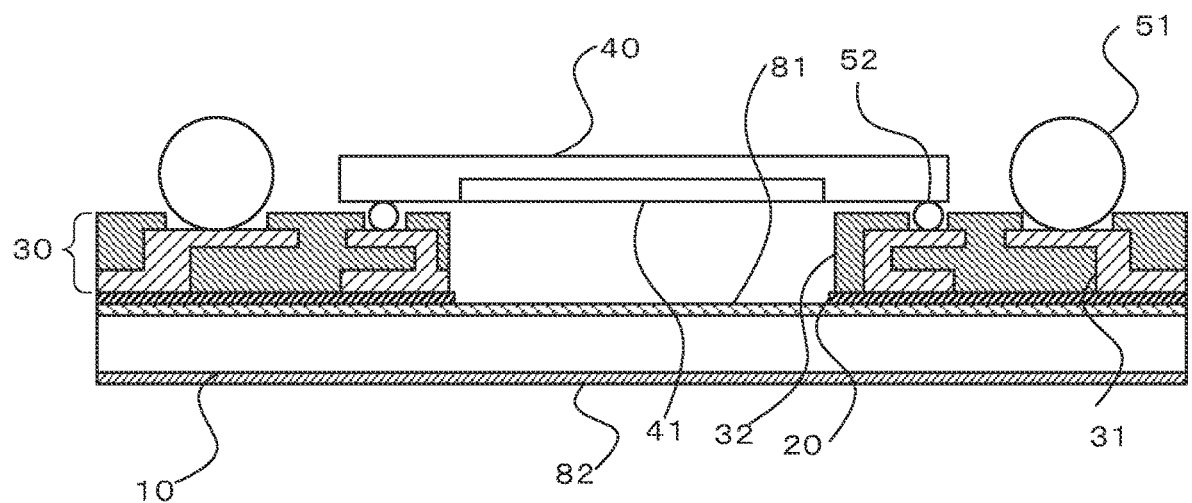
FIG. 13 illustrates an optical device package according to a modification.

The above-described embodiment is directed to an example in which the warpage reducing film 20 is disposed on the glass substrate 10. As illustrated in FIG. 13, a silicon oxide ($SiO_x$) layer 81 may be further provided between the glass substrate 10 and the warpage reducing film 20, provided that the warpage reducing film 20 can reduce warpage of the glass substrate 10. For example, this silicon oxide layer 81 serves as an etching stop layer (ESL) because of its etching rate lower than that of the warpage reducing film 20 containing silicon nitride and can thus prevent the glass substrate 10 from being etched and losing optical functionality, in the step of patterning the warpage reducing film (Step S102). The silicon oxide layer 81 is also effective as an α-ray shielding film and can thus shield α-rays emitted from the outside of the package or from the glass substrate 10, thereby preventing the electrical properties from being adversely affected by α-ray irradiation of the light-receiving region 41 of the semiconductor element 40. Furthermore, the glass substrate 10 may also include an antireflective layer 82, which is a film with optical functionality, on the surface opposite to the surface provided with the redistribution layer 30 entirely or within the portion corresponding to the light-receiving region 41. This configuration can reduce the noise components of the light incident to the semiconductor element 40, which may inhibit detection.

Figure 14:
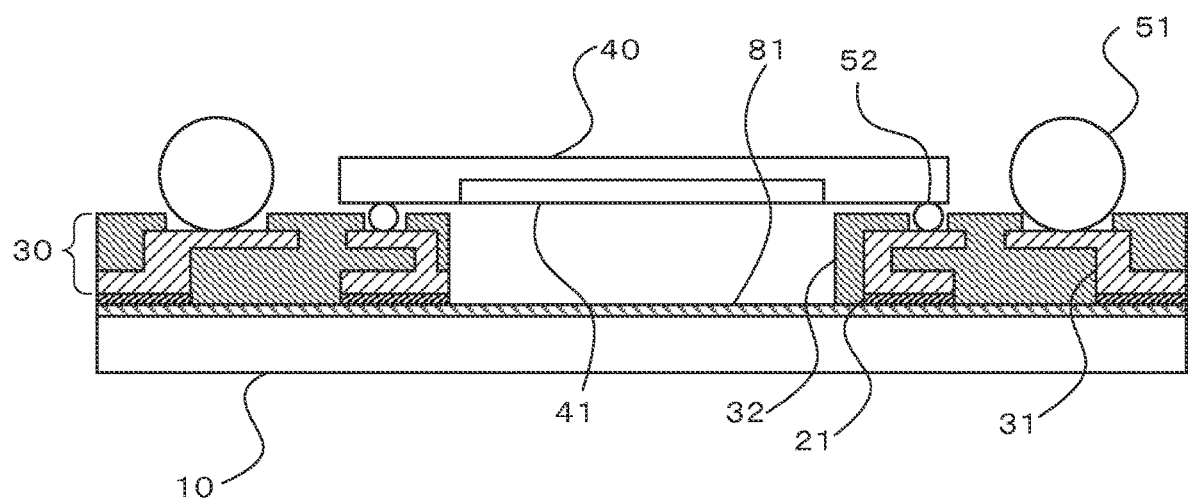
FIG. 14 illustrates an optical device package according to another modification.

The above-described embodiment is directed to an example in which the warpage reducing film 20 is formed on the glass substrate 10 in the portion to be provided with the redistribution layer 30. Alternatively, as illustrated in FIG. 14, a warpage reducing film 21 may be selectively formed in the portion to be provided with the wiring sublayer 31 of the redistribution layer 30. In this case, after formation of the silicon oxide layer 81 on the entire glass substrate 10, the warpage reducing film 21 is formed on the surface of the silicon oxide layer 81 in the portion to be provided with the wiring sublayer 31 of the redistribution layer 30 by patterning. This process locates the wiring sublayer 31 of the redistribution layer 30 on the warpage reducing film 21 and locates the insulating sublayer 32 on the silicon oxide layer 81. Such selective formation of appropriate interfaces between the stacked layers can achieve excellent adherence between the wiring sublayer 31 and the insulating sublayer 32, in view of the facts that copper has better adherence to silicon nitride than that to silicon oxide and the insulating sublayer 32 may have bad adherence to silicon oxide. The patterning of the warpage reducing film 21 can be involved in the step of patterning the warpage reducing film (Step S102) and does not increase the number of steps.

The above-described embodiment is directed to an example in which the semiconductor element 40 has the light-receiving region 41. Alternatively, the semiconductor element 40 may also be an element, such as light emitting diode (LED) or organic electroluminescence (EL) device, having a light-emitting region. Also in this case, the portion corresponding to the light-emitting region of the semiconductor element 40 lacks the warpage reducing film 20 and the redistribution layer 30, so that the warpage reducing film 20 and the redistribution layer 30 do not affect the transmission characteristics of light emitted from the light-emitting region.

The above-described embodiment is directed to an example in which the warpage reducing film 20 contains silicon nitride. The warpage reducing film 20 may also contain components other than silicon nitride, provided that the warpage reducing film 20 can cause the surface of the glass substrate 10 provided with the warpage reducing film 20 to have convex warpage. The warpage reducing film 20 may contain any material that can bring about the same effects as those of the warpage reducing film 20 containing silicon nitride.

Examples

The effects of the warpage reducing film 20 included in the optical device package 100 were demonstrated through some examples. These examples are just some embodiments of the present disclosure and not to be construed as limiting the scope of the present disclosure.
Effects of Reducing Warpage A glass substrate of Example 1 and a glass substrate of Comparative Example 1 were fabricated to confirm whether silicon nitride films on glass substrates bring about effects of reducing warpage of the glass substrates.

The glass substrate of Example 1 was prepared by forming a silicon nitride film having a thickness of 300 nm on a glass substrate having a size of 370 mm×470 mm×0.7 mm, and forming a polyimide film having a thickness of 15 μm on the entire substrate. In contrast, the glass substrate of Comparative Example 1 was prepared by forming a polyimide film having a thickness of 15 μm on the entire glass substrate having a size of 370 mm×470 mm×0.7 mm, without forming a silicon nitride film.

The glass substrate of Comparative Example 1 had a concave warpage of 0.5 mm to 0.6 mm. In contrast, the glass substrate of Example 1 had a reduced warpage of 0.05 mm or smaller. That is, the silicon nitride film was able to reduce at least 90% of the warpage of the glass substrate in comparison to that of Comparative Example 1. This examination revealed that a silicon nitride film can reduce concave warpage of a glass substrate provided with a polyimide film.

Portions Provided with a Silicon Nitride Film

Figure 15:
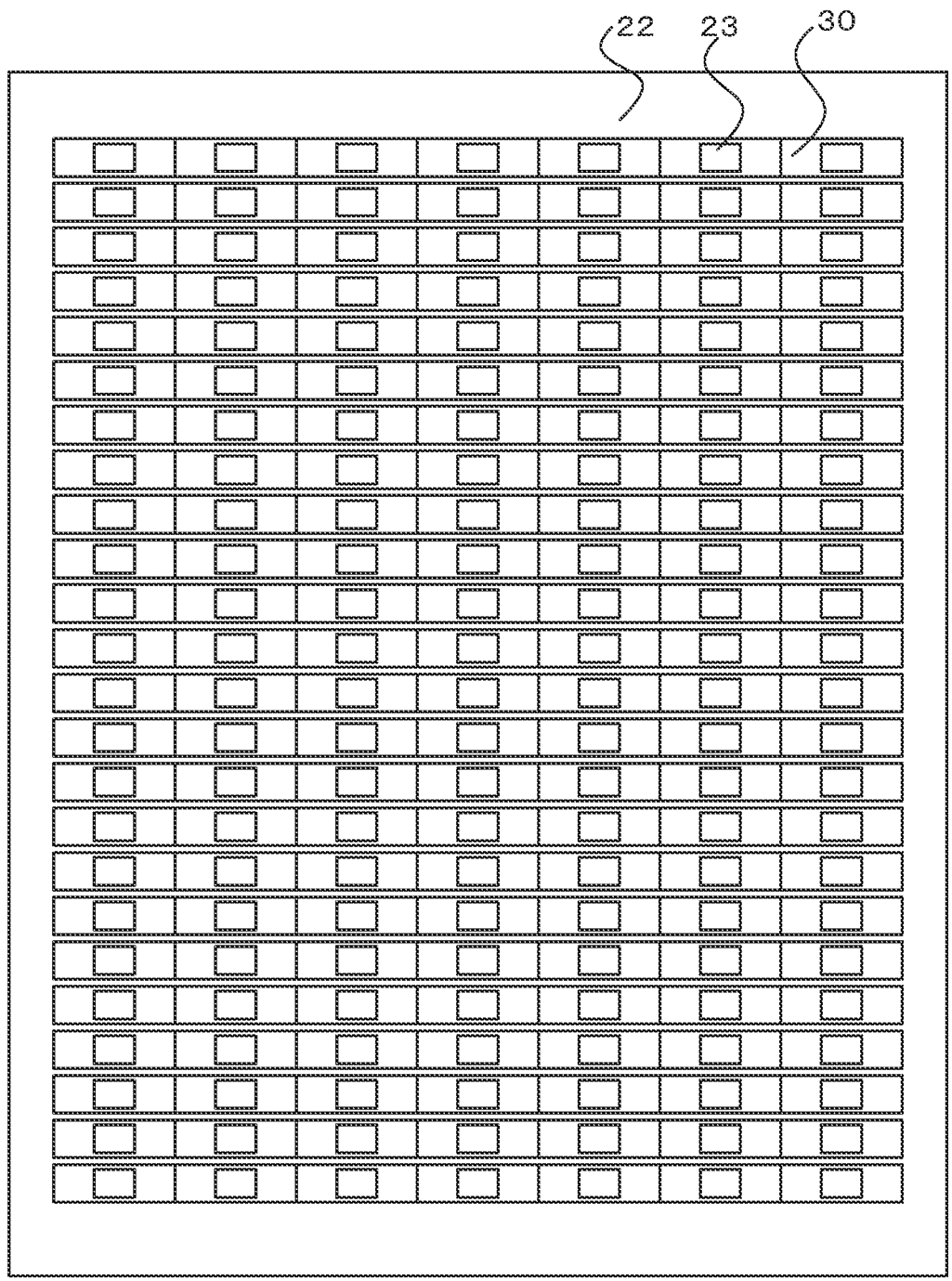
FIG. 15 illustrates regions of a glass substrate provided with a silicon nitride film.

A product fabricated by forming a silicon nitride film on the entire glass substrate and forming a single redistribution layer 30 was compared with a product fabricated by forming a silicon nitride film 22 on the glass substrate except for openings 23 and forming a single redistribution layer 30 as illustrated in FIG. 15. The warpages of these products had no significant difference when the ratio of the sum of the areas of the openings 23 to the total area of the glass substrate was 12.3% or smaller. This ratio of the sum of the areas of the openings 23 to the total area of the glass substrate is a mere example and may vary depending on factors, such as the shapes and positions of the openings and the thickness of the silicon nitride film 22.

Thickness of a Warpage Reducing Film

The optimum thickness of the warpage reducing film 20 was then explored. As illustrated in Table 1, one or more silicon nitride films were formed on a glass substrate having a size of 370 mm×470 mm×0.7 mm, to determine a relationship between the thickness of the silicon nitride film and the amount of warpage of the glass substrate.

TABLE 1

|  | SUBSTANTIAL SINGLE REDISTRIBUTION LAYER | | | SUBSTANTIAL TWO REDISTRIBUTION LAYERS | | | SUBSTANTIAL THREE REDISTRIBUTION LAYERS | |
| --- | --- | --- | --- | --- | --- | --- | --- | --- |
| SIZE OF GLASS SUBSTRATE | 370 mm × 470 mm × 0.7 mm | | | | | | | |
| THICKNESS OF SILICON NITRIDE FILM (nm) | 300 | 600 | 900 | 300 | 600 | 900 | 600 | 900 |
| THICKNESS OF Cu LAYER | 5 μm | | | | | | | |
| THICKNESS OF POLYIMIDE LAYER | 8 μm | | | | | | | |
| NUMBER OF Cu LAYERS | 1 | | | 2 | | | 3 | |

Figure 16:
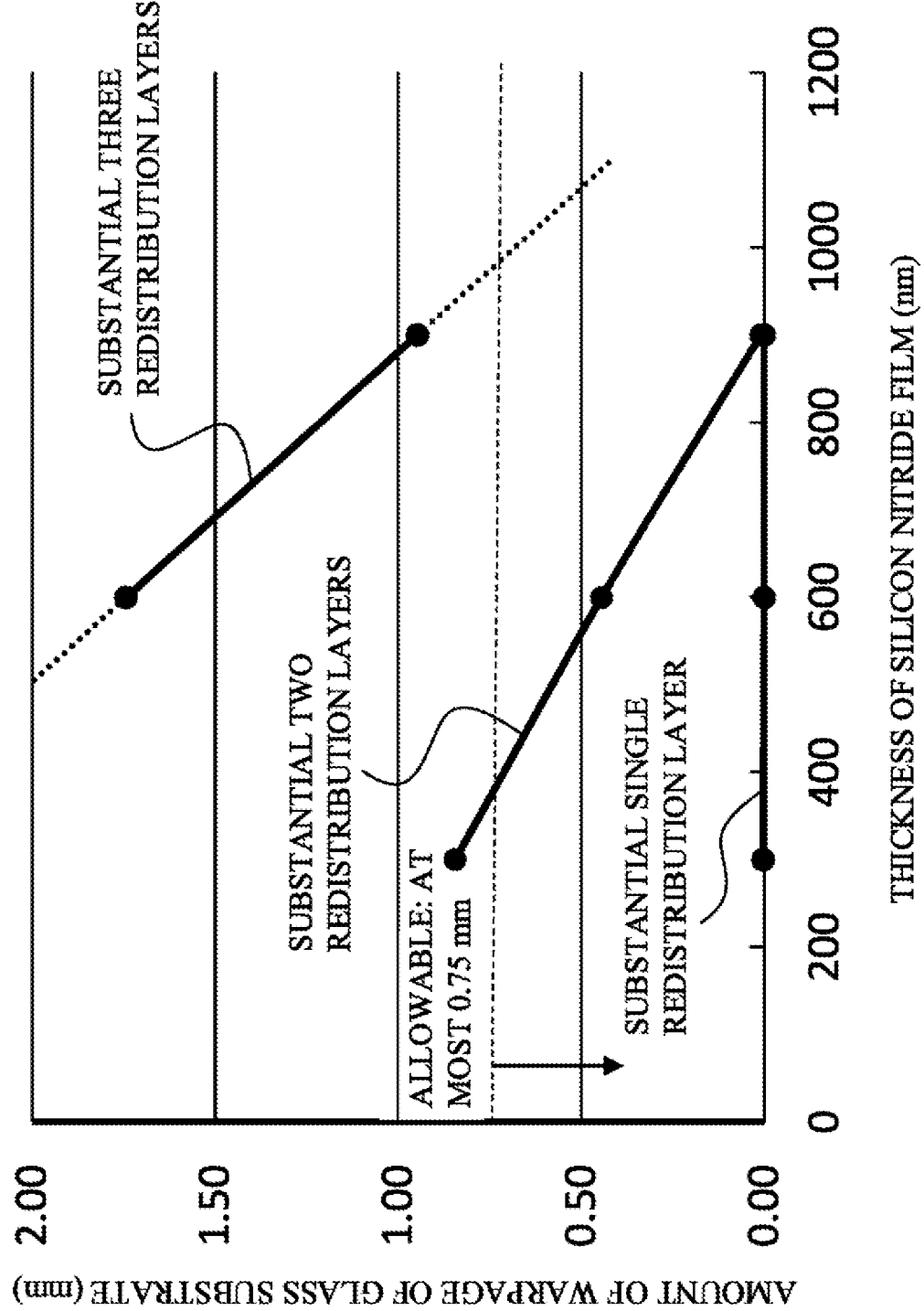
FIG. 16 illustrates a relationship between the amount of warpage of a glass substrate and the thickness of a silicon nitride film.

FIG. 16 illustrates results of determining the relationship between the thickness of the silicon nitride film and the amount of warpage of the glass substrate. Previous examinations had revealed that the amount of concave warpage of a glass substrate allowable in an apparatus, which is most susceptible to a small amount of warpage, was at most 0.75 mm. A glass substrate provided with three redistribution layers 30 was found to be allowable when the silicon nitride films had a thickness of approximately 1,000 nm. A glass substrate provided with two redistribution layers 30 could be substantially free from warpage, when the silicon nitride films had a thickness of 900 nm, for example. In practice, the silicon nitride film is only required to reduce warpage to an amount allowable in the fabrication process, because warpage to some extent across the entire glass substrate hardly affects each of the divided optical device packages. A silicon nitride film having an excessively large thickness is not preferable because such a film requires a long period of formation, thereby extending the time for the process and impairing the productivity.

Figure 17:
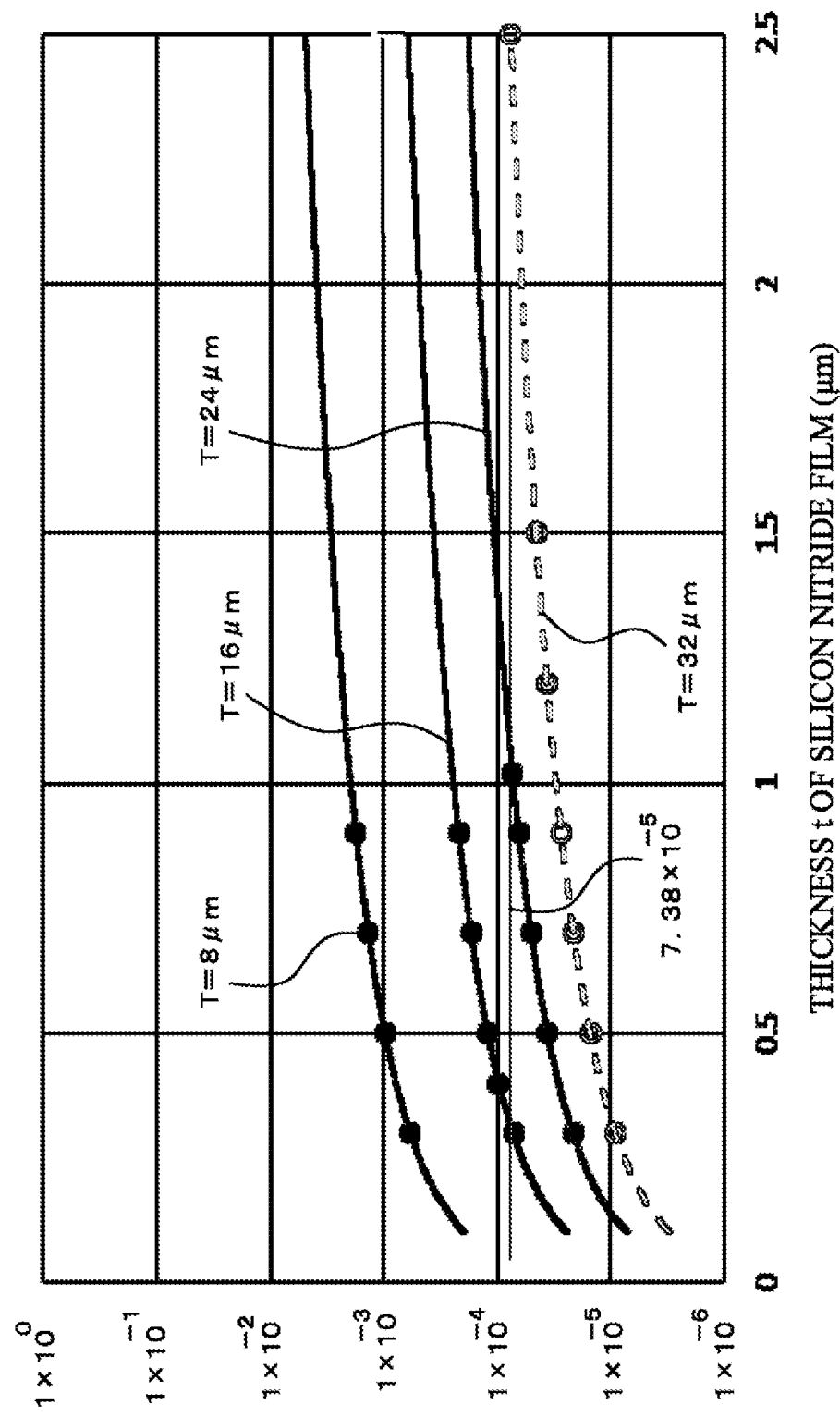
FIG. 17 illustrates a relationship between the thickness t of a silicon nitride film and the cube of the total thickness T of a redistribution layer.

The thickness t of a silicon nitride film, serving as a warpage reducing film, disposed on a glass substrate having a size of 370 mm×470 mm×0.7 mm was then plotted, using the cube of the total thickness T of a redistribution layer (which is substantially equal to the thicknesses of the wiring sublayer and the insulating sublayer) as a parameter, as illustrated in FIG. 17. The graph revealed that the warpage of the glass substrate fell within the maximum amount allowable in the process when $t/T^3 \geq 7.38 \times 10^{-5}$ was satisfied where T indicates the total thickness of the redistribution layer and t indicates the thickness of the warpage reducing film. Specifically, the warpage of the glass substrate within the maximum amount allowable in the process was achieved by the silicon nitride film having a thickness t of 0.4 μm or larger in the case of the total thickness T of 16 μm, the silicon nitride film having a thickness t of 1.02 μm or larger in the case of the total thickness T of 24 μm, and the silicon nitride film having a thickness t of 2.5 μm or larger in the case of the total thickness T of 32 μm. In FIG. 17, the graph of T=32 μm represents estimated values.

The following describes a reason why the warpage of the glass substrate was deemed to fall within the amount allowable in the process when $t/T^3 \geq 7.38 \times 10^{-5}$ was satisfied where T indicates the total thickness of the redistribution layer 30 and t indicates the thickness of the warpage reducing film.

Figure 18A:
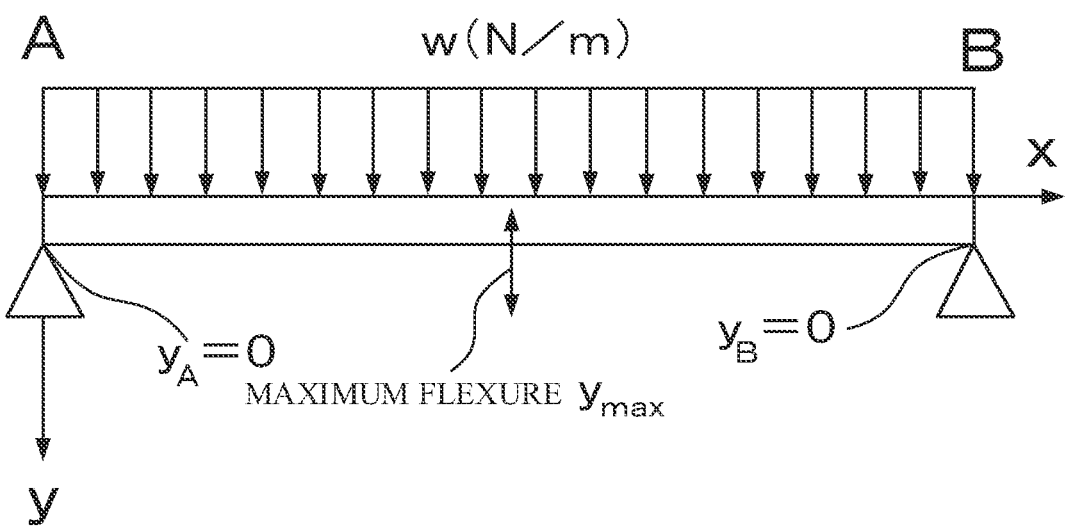
FIG. 18A is a diagram for describing the maximum flexure of a glass substrate.

When a glass substrate receives a uniformly distributed load due to the own weight while the glass substrate is supported at both ends A and B as illustrated in FIG. 18A, the maximum flexure (warpage) $y_{max}$ can be approximated by Expression (1) below:

$$y_{max} = 5 \times w \times s^4 / 384 \times E \times I \quad (1)$$

where $y_{max}$ indicates the maximum flexure, w indicates the weight (N/m), s indicates the distance between both ends, E indicates the Young modulus, and I indicates the second moment of area.

Figure 18B:
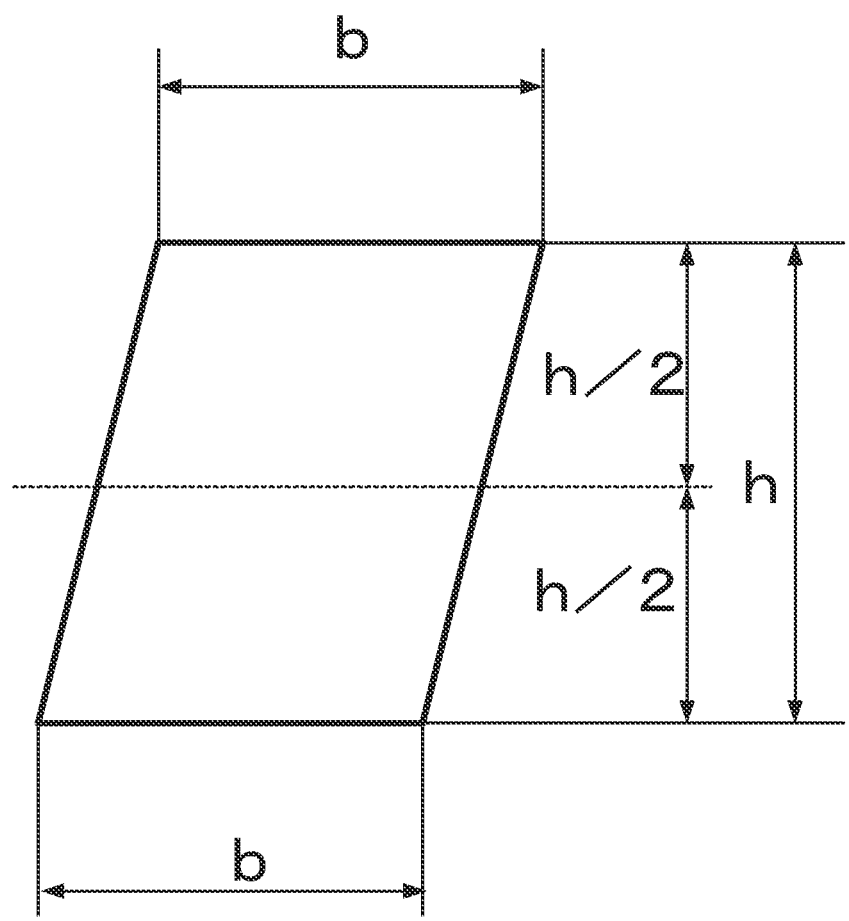
FIG. 18B is a diagram for describing a second moment of area.

The second moment of area I indicates the difficulty of bending an object (or the resistance of the object to a force of bending) and varies depending on the cross-sectional shape of the object. The second moment of area I in a rectangular flat plate having a cross-sectional width b and a cross-sectional height h, as illustrated in FIG. 18B, can be calculated by Expression (2) below:

$$I = b \times h^3 / 12 \quad (2)$$

As is apparent from Expressions (1) and (2), the amount of flexure (warpage) can be expressed using the cube of the cross-sectional height (h). The correlation of the thickness (t) of the silicon nitride film and the cube ($T^3$) of the total thickness of the redistribution layer 30 and results of examination revealed that the value $t/T^3$ can be used as a boundary value. The values $t/T$, $(t/T)^3$, and $t^3/T$ were not able to achieve a boundary condition.

Adherence

A silicon oxide film and a silicon nitride film disposed on glass substrates were then evaluated regarding adherence to each of a copper seed film (copper sputtered film) and an insulating polyimide film.

A glass substrate provided with a 100-nm silicon oxide film thereon, and a glass substrate sequentially provided with a 100-nm silicon oxide film and a 300-nm silicon nitride film were prepared and each provided with a 200-nm copper seed film or an insulating polyimide film. The surfaces of the copper seed film and the insulating polyimide film were each scarred with a cutter, and provided with an adhesive tape. The adhesive tapes were then peeled to check whether the films were chipped (by a cross-cut test corresponding to JIS-K5600-5-6). The results of this test are illustrated in Table 2. In Table 2, "H" indicates high adherence or the absence of chipping, and "L" indicates low adherence or the existence of chipping.

TABLE 2

| UNDERLYING FILM | ADHERENCE OF COPPER SEED FILM | ADHERENCE OF POLYIMIDE FILM |
|---|---|---|
| SILICON OXIDE FILM (100 nm) | L | H |
| SILICON NITRIDE FILM (300 nm) | H | L |

This test revealed that the copper seed film had better adherence to the silicon nitride film than that to the silicon oxide film. The polyimide film had better adherence to the silicon oxide film, in contrast to the copper seed film. Accordingly, the selective arrangement of silicon nitride and silicon oxide at the interfaces against the copper seed film and the polyimide film can further improve the adherence of the redistribution layer 30.

As described above, the glass substrate of Example 1, which was fabricated by forming a silicon nitride film having a thickness of 300 nm on a glass substrate having a size of 370 mm×470 mm×0.7 mm and forming a polyimide film having a thickness of 15 μm on the entire substrate, had a reduced warpage of 0.05 mm or smaller. That is, the silicon nitride film was able to reduce at least 90% of the warpage of the glass substrate in comparison to that of Comparative Example 1, which was fabricated by forming a polyimide film having a thickness of 15 μm on the entire substrate without forming a silicon nitride film and had a concave warpage of 0.5 mm to 0.6 mm. The warpage of the glass substrate was found to fall within the maximum amount allowable in the process when $t/T^3 \geq 7.38 \times 10^{-5}$ was satisfied where T indicates the total thickness of the redistribution layer 30 and t indicates the thickness of the warpage reducing film. Also discovered was that the selective arrangement of silicon nitride and silicon oxide at the interfaces against the copper seed film and the polyimide film can further improve the adherence of the redistribution layer 30, because the copper seed film had better adherence to the silicon nitride film than that to the silicon oxide film and the polyimide film had better adherence to the silicon oxide film in contrast to the copper seed film.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. An optical device package, comprising:
    a glass substrate;
    a warpage reducing film disposed directly or indirectly on the glass substrate;
    a redistribution layer including a wiring sublayer and an insulating sublayer, the wiring sublayer and the insulating sublayer being at least partially disposed on the warpage reducing film; and
    a semiconductor element mounted on the redistribution layer, wherein
    the semiconductor element includes an optical element to emit or receive light via the glass substrate, and
    the glass substrate lacks the warpage reducing film and the redistribution layer in a portion opposed to a light-emitting region or a light-receiving region of the optical element.

2. The optical device package according to claim 1, wherein $t/T^3 \geq 7.38 \times 10^{-5}$ is satisfied where T indicates a total thickness of the redistribution layer and t indicates a thickness of the warpage reducing film.

3. The optical device package according to claim 1, wherein the warpage reducing film contains silicon nitride.

4. The optical device package according to claim 1, wherein the glass substrate has a thickness of 0.3 mm or larger and 1.1 mm or smaller.

5. The optical device package according to claim 1, further comprising an optically functional film on a surface of the glass substrate opposite to a surface of the glass substrate provided with the warpage reducing film.

6. The optical device package according to claim 1, wherein
    a silicon oxide film and a silicon nitride film are disposed in sequence on the glass substrate, the silicon nitride film serving as the warpage reducing film, and
    the silicon nitride film is disposed in a portion to be provided with the wiring sublayer, the wiring sublayer is disposed on the silicon nitride film, and the insulating sublayer is disposed on the silicon oxide film.

7. An optical device package, comprising:
    a glass substrate;
    a warpage reducing film disposed directly or indirectly on the glass substrate;
    a redistribution layer including a wiring sublayer and an insulating sublayer, the wiring sublayer and the insulating sublayer being at least partially disposed on the warpage reducing film; and
    a semiconductor element mounted on the redistribution layer, wherein
    $t/T^3 \geq 7.38 \times 10^{-5}$ is satisfied where T indicates a total thickness of the redistribution layer and t indicates a thickness of the warpage reducing film,
    the semiconductor element includes an optical element to emit or receive light via the glass substrate, and
    the glass substrate lacks the warpage reducing film and the redistribution layer in a portion opposed to a light-emitting region or a light-receiving region of the optical element.

* * * * *